United States Patent
Fujita et al.

(10) Patent No.: US 8,973,807 B2
(45) Date of Patent: Mar. 10, 2015

(54) BONDING TOOL, ELECTRONIC COMPONENT MOUNTING APPARATUS, AND MANUFACTURING METHOD OF BONDING TOOL

(75) Inventors: Ryo Fujita, Hyogo (JP); Hiroshi Ebihara, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 13/640,776

(22) PCT Filed: Apr. 12, 2011

(86) PCT No.: PCT/JP2011/002144
§ 371 (c)(1),
(2), (4) Date: Oct. 12, 2012

(87) PCT Pub. No.: WO2011/145266
PCT Pub. Date: Nov. 24, 2011

(65) Prior Publication Data
US 2013/0026211 A1 Jan. 31, 2013

(30) Foreign Application Priority Data
May 20, 2010 (JP) .................................. 2010-116011

(51) Int. Cl.
*B23K 20/10* (2006.01)
*B23K 5/20* (2006.01)
(Continued)

(52) U.S. Cl.
CPC . *H01L 24/75* (2013.01); *B23K 1/00* (2013.01); *B29C 65/08* (2013.01); *B29C 65/081* (2013.01);
(Continued)

(58) Field of Classification Search
CPC ........ B23K 1/00; B23K 20/10; B23K 20/103; B23K 20/106; B29C 65/08; B29C 65/081
USPC ............. 228/110.1, 1.1, 111; 156/73.1, 580.1
See application file for complete search history.

(56) References Cited

U.S. PATENT DOCUMENTS 3,809,553 A * 5/1974 Peaslee ........................... 419/33
6,073,827 A 6/2000 Razon et al.
(Continued)

FOREIGN PATENT DOCUMENTS

CN 101577218 A 5/2009
JP 02-121830 A 5/1990
(Continued)

OTHER PUBLICATIONS

English computer translation of JP2007319876A.*
(Continued)

*Primary Examiner* — Erin Saad
(74) *Attorney, Agent, or Firm* — RatnerPrestia

(57) ABSTRACT

In some cases, it is difficult to carry out ultrasonic joining of high quality with a conventional bonding tool. A bonding tool includes: a horn that transmits an ultrasonic vibration; an ultrasonic vibrator that is provided at one end of the horn, and generates the ultrasonic vibration; and an electronic component holding part that holds an electronic component, wherein the electronic component holding part has a male fitting part in a shape of a tapering-off, and an electronic component holding face that holds the electronic component on an opposite side to the male fitting part, a female fitting part in a shape according to a shape of the male fitting part is formed in a predetermined face of the horn, and the male fitting part is fitted into the female fitting part via an adhesion layer.

7 Claims, 12 Drawing Sheets

(51) Int. Cl.
  *B23K 1/06* (2006.01)
  *B29C 65/00* (2006.01)
  *B29C 65/08* (2006.01)
  *H01L 23/00* (2006.01)
  *B23K 1/00* (2006.01)
  *H05K 13/04* (2006.01)

(52) U.S. Cl.
  CPC ............... *H01L 24/13* (2013.01); *H01L 24/16* (2013.01); *H01L 24/81* (2013.01); *H01L 2224/13144* (2013.01); *H01L 2224/75303* (2013.01); *H01L 2224/7531* (2013.01); *H01L 2224/75355* (2013.01); *H01L 2224/75745* (2013.01); *H01L 2224/75801* (2013.01); *H01L 2224/75821* (2013.01); *H01L 2224/759* (2013.01); *H01L 2224/81205* (2013.01); *H01L 2224/81801* (2013.01); *H01L 2924/01004* (2013.01); *H01L 2924/01047* (2013.01); *H01L 2924/01079* (2013.01); *H01L 2924/01033* (2013.01); *H01L 2924/01074* (2013.01); *H01L 2924/014* (2013.01); *H05K 13/0408* (2013.01)
  USPC ........ 228/110.1; 228/1.1; 228/111; 156/73.1; 156/580.1

(56) References Cited

U.S. PATENT DOCUMENTS

| | | | |
|---|---|---|---|
| 6,743,331 | B2 | 6/2004 | Takahashi et al. |
| 7,424,966 | B2 | 9/2008 | Kainuma et al. |
| 2003/0136523 | A1 | 7/2003 | Takahashi et al. |
| 2008/0265003 | A1 | 10/2008 | Kainuma et al. |
| 2009/0277951 | A1 | 11/2009 | Ebihara et al. |

FOREIGN PATENT DOCUMENTS

| | | |
|---|---|---|
| JP | 2003-218164 A | 7/2003 |
| JP | 2005-224821 A | 8/2005 |
| JP | 3788351 B2 | 6/2006 |
| JP | 2006-210534 A | 8/2006 |
| JP | 2007-220806 A | 8/2007 |
| JP | 2007-319876 A | 12/2007 |

OTHER PUBLICATIONS

JP2007-220806 computer english translation.*
International Search Report for Application No. PCT/JP2011/002144, dated May 17, 2011, 2 pgs.
The People's Republic of China Office Action with Search Report for Application No. 201180023840.4 dated Sep. 23, 2014.

* cited by examiner

BONDING TOOL, ELECTRONIC COMPONENT MOUNTING APPARATUS, AND MANUFACTURING METHOD OF BONDING TOOL

CROSS-REFERENCE TO RELATED APPLICATIONS

This application is a U.S. National Phase Application of PCT International Patent Application No. PCT/JP2011/002144 filed Apr. 12, 2011, claiming the benefit of priority of Japanese Patent Application No. 2010-116011, filed May 20, 2010, all of which are incorporated by reference herein in their entirety.

TECHNICAL FIELD

The present invention relates to a bonding tool, an electronic component mounting apparatus, and a manufacturing method of a bonding tool for mounting electronic components on a circuit board, for example.

BACKGROUND ART

Various joining methods are known for joining a bump electrode of an electronic component to an electrode of a printed circuit board.

For example, an ultrasonic joining method, which is one of such joining methods, is able to join electronic components to a circuit board in a short time.

Here, the ultrasonic joining method is a joining method that allows, while pressing an electronic component against a circuit board, the electronic component to vibrate by ultrasonic vibration so as to join electrically an electrode of the electronic component to an electrode of the circuit board at the atomic level, using bonding by destruction and dispersion of the surface coating generated by a local slip in the joining face.

Now, referring to FIG. 10, the constitution and operation of a conventional bonding tool 9 that uses the above-mentioned ultrasonic joining method is described.

Further, FIG. 10 is a schematic front view of the conventional bonding tool 9.

The conventional bonding tool 9 is an apparatus for allowing an electronic component 8 to vibrate by an ultrasonic vibrator 52 so as to carry out bonding of the electronic component 8 to a circuit board 81 (for example, see Japanese Patent No. 3788351).

The bonding tool 9 comprises a horn 91, the ultrasonic vibrator 52, and an electronic component holding part 93.

The electronic component holding part 93 has a male fitting part 932 in the shape of a stumpy column, a female fitting part 9151 in the shape according to the shape of the male fitting part 932 is formed in the horn 91, and the male fitting part 932 is fitted into the female fitting part 9151 via an adhesion layer 916.

In the description hereinafter, the X axis, the Y axis and the Z axis for defining an orthogonal coordinate system in three dimensional space, which are orthogonal to each other, are used.

The horn 91 is substantially a prism in shape, whose longer direction is the X direction in which ultrasonic vibration is transmitted. The horn 91 has a symmetry plane S1 parallel to the YZ plane, a symmetry plane S2 parallel to the XY plane, and a symmetry plane S3 (not shown) parallel to the ZX plane.

The female fitting part 9151 in the shape according to the shape of the male fitting part 932 is formed in a horn protruding part 915 that is provided on the lower face among the two faces of the horn 91 parallel to the XY plane, which is on the (−Z) side. The female fitting part 9151 is a groove whose cross-sectional shape is rectangular.

The electronic component holding part 93 comprises the male fitting part 932 in the shape of a prism, and an electronic component holding face 5311 being provided on a tip end part 531, which holds the electronic component 8 on the opposite side to the male fitting part 932. The male fitting part 932 is a ridge whose cross-sectional shape is rectangular.

Here, mainly referring to FIGS. 11 and 12, the constitution is described in more detail in which the male fitting part 932 of the electronic component holding part 93 is fitted into the female fitting part 9151 of the horn 91 via the adhesion layer 916.

Further, FIG. 11 is a schematic front view of a vicinity of the electronic component holding part 93 of the conventional bonding tool 9. Moreover, FIG. 12 is a schematic front view of a vicinity of the electronic component holding part 93, to which ultrasonic vibration is being given, of the conventional bonding tool 9.

The male fitting part 932 has a top face F93, and side faces F93' and F93".

The female fitting part 9151 has a bottom face F91, and side faces F91' and F91".

Manufacture of the bonding tool 9 is able to be carried out by arranging a brazing material for forming the adhesion layer 916 between the male fitting part 932 and the female fitting part 9151, forming the adhesion layer 916 by heating the male fitting part 932 and the female fitting part 9151 with pressurization, and fitting the male fitting part 932 into the female fitting part 9151. For example, a thin sheet-like brazing material can be stuck on an adhesion face of the male fitting part 932 or the female fitting part 9151, so that the brazing material is melted through increase of the temperature with the electronic component holding part 93 and the horn 91 being sandwiched with pressurization and the temperature is decreased afterward.

Here, in order to easily perform the process of inserting the male fitting part 932 deeply into the female fitting part 9151 in a state where the thin sheet-like brazing material is stuck on the adhesion face as mentioned above, sufficient clearance has to be ensured beforehand between the male fitting part 932 and the female fitting part 9151.

On that account, the width W93 of the top face F93 has to be sufficiently smaller than the width W91 of the bottom face F91.

SUMMARY OF INVENTION

Problems to be Solved by Invention

However, it has become clear that the above-mentioned conventional bonding tool 9 can be unsuitable for carrying out ultrasonic joining of higher quality.

The present inventor has conducted an analysis of the cause as follows.

Namely, when the width W93 is taken to be sufficiently smaller than the width W91 in order to ensure sufficient clearance between the male fitting part 932 and the female fitting part 9151 as mentioned before, a position aberration of the electronic component holding part 93 with respect to the X direction is liable to be generated while the electronic component holding part 93 and the horn 91 are sandwiched to be pressurized in a state where the brazing material is melted as mentioned before.

When such a position aberration is generated, the thickness t' of the adhesion layer 916 between the side face F93' and the side face F91' does not equal the thickness t'' of the adhesion layer 916 between the side face F93'' and the side face F91'' (namely, t'≠t'').

Then, there is a fear that plane symmetry with respect to the symmetry plane S1 of the electronic component holding part 93 is impaired while the male fitting part 932 is fitted into the female fitting part 9151.

Consequently, preferable vibration characteristics and vibration transmission characteristics may not be realized.

And, as shown in FIG. 11, in the above-mentioned conventional bonding tool 9, the thickness t of the adhesion layer 916 between the top face F93 and the bottom face F91 is apt to get smaller conversely.

Then, as shown in FIG. 12, swell of the horn 91 that is to be generated as a displacement in the Z direction orthogonal to the X direction, in which ultrasonic vibration is transmitted, propagates to the electronic component holding part 93 as it is without being absorbed by the adhesion layer 916 and, in a case where the size of the electronic component 8 is relatively large or anything, there is a fear that flatness of the electronic component holding face 5311 is impaired.

Consequently, homogeneity of the ultrasonic vibration that is given to the electronic component 8 may be deteriorated.

Further, even if a dimensioning is carried out such that a global tilt of the electronic component holding face 5311 due to flexural vibration of the horn protruding part 915 and the tip end part 531, and a tilt of the root of the horn protruding part 915 due to flexure of the main body of the horn 91 caused by changes of its width in a resonant state cancel out each other so that the electronic component holding face 5311 is kept as a whole in a almost horizontal state, it is impossible to avoid impairment of flatness of the electronic component holding face 5311 because of the above-mentioned swell.

An object of the present invention is, in view of the above-mentioned conventional problems, to provide a bonding tool, an electronic component mounting apparatus, and a manufacturing method of a bonding tool capable of carrying out ultrasonic joining of higher quality.

Means of Solving Problem

The $1^{st}$ aspect of the present invention is
a bonding tool, comprising:
a horn that transmits an ultrasonic vibration;
an ultrasonic vibrator that is provided at one end of the horn, and generates the ultrasonic vibration; and
an electronic component holding part that holds an electronic component, wherein
the electronic component holding part has a male fitting part in a shape of a tapering-off, and an electronic component holding face that holds the electronic component on an opposite side to the male fitting part,
a female fitting part in a shape according to a shape of the male fitting part is formed in a predetermined face of the horn, and
the male fitting part is fitted into the female fitting part via an adhesion layer.

The $2^{nd}$ aspect of the present invention is
the bonding tool according to the $1^{st}$ aspect of the present invention, wherein
the male fitting part is a ridge whose cross-sectional shape is trapezoidal,
the female fitting part is a groove whose cross-sectional shape is trapezoidal,
a top face of the ridge faces on a bottom face of the groove via the adhesion layer, and
a width of the top face of the ridge is larger than a width of the bottom face of the groove.

The $3^{rd}$ aspect of the present invention is
the bonding tool according to the $2^{nd}$ aspect of the present invention, wherein
the horn is substantially a prism in shape, whose longer direction is a direction in which the ultrasonic vibration is transmitted, and
the groove is formed in a face on a lower side of the prism, in a direction orthogonal to the longer direction of the prism.

The $4^{th}$ aspect of the present invention is
the bonding tool according to the $3^{rd}$ aspect of the present invention, wherein
a thickness of the adhesion layer between the top face of the ridge and the bottom face of the groove is larger than a thickness of the adhesion layer between a side face of the ridge and a side face of the groove on which the side face of the ridge faces via the adhesion layer.

The $5^{th}$ aspect of the present invention is
the bonding tool according to the $3^{rd}$ aspect of the present invention, wherein
200 μm or less is a thickness of the adhesion layer.

The $6^{th}$ aspect of the present invention is
the bonding tool according to the $3^{rd}$ aspect of the present invention, wherein
1/10 or more is a ratio (height/width) of a height of the electronic component holding part in a direction orthogonal to the electronic component holding face to a width of the electronic component holding part in the direction in which the ultrasonic vibration is transmitted.

The $7^{th}$ aspect of the present invention is
the bonding tool according to the $3^{rd}$ aspect of the present invention, wherein
Young's modulus of a material that constitutes the horn is larger than Young's modulus of a material that constitutes the adhesion layer, and
Young's modulus of a material that constitutes the electronic component holding part is larger than the Young's modulus of the material that constitutes the adhesion layer.

The $8^{th}$ aspect of the present invention is
the bonding tool according to the $3^{rd}$ aspect of the present invention, wherein
a material that constitutes the adhesion layer is a brazing material.

The $9^{th}$ aspect of the present invention is
an electronic component mounting apparatus, comprising:
a circuit board holding part that holds a circuit board;
an electronic component supplying part that supplies the electronic component; and
an electronic component mounting unit that mounts, on the held circuit board, the supplied electronic component, wherein
the electronic component mounting unit has an electronic component mounting part,
the electronic component mounting part has a pressing unit, and the bonding tool according to the $1^{st}$ aspect of the present invention, and
the pressing unit presses, via the electronic component holding part of the bonding tool, the electronic component against the circuit board.

The $10^{th}$ aspect of the present invention is
a manufacturing method of the bonding tool according to the $1^{st}$ aspect of the present invention, comprising:

a male fitting part forming step of forming the male fitting part;

a female fitting part forming step of forming the female fitting part;

a brazing material arranging step of arranging a brazing material for forming the adhesion layer between the male fitting part and the female fitting part; and a fitting step of forming the adhesion layer by heating the male fitting part and the female fitting part in a thermostatic bath with pressurization using a predetermined jig, and fitting the male fitting part into the female fitting part.

Effects of Invention

By the present invention, it is possible to provide a bonding tool, an electronic component mounting apparatus, and a manufacturing method of a bonding tool capable of carrying out ultrasonic joining of higher quality.

MODES FOR CARRYING OUT INVENTION

Figure 1:
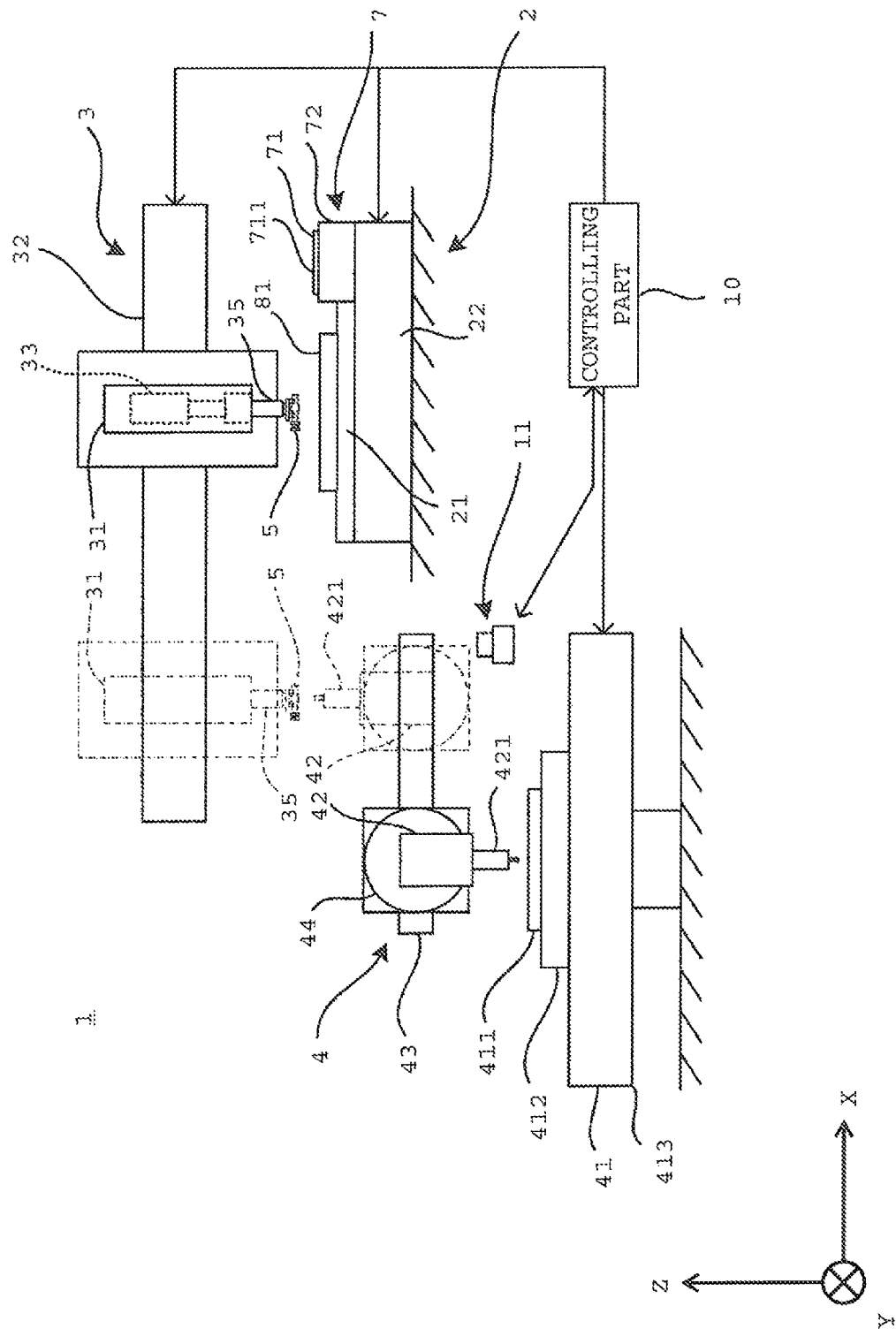
FIG. 1 is a schematic front view of an electronic component mounting apparatus in an embodiment pertaining to the present invention.

Hereinafter, referring to the drawings, embodiments pertaining to the present invention are described in detail.

Figure 2:
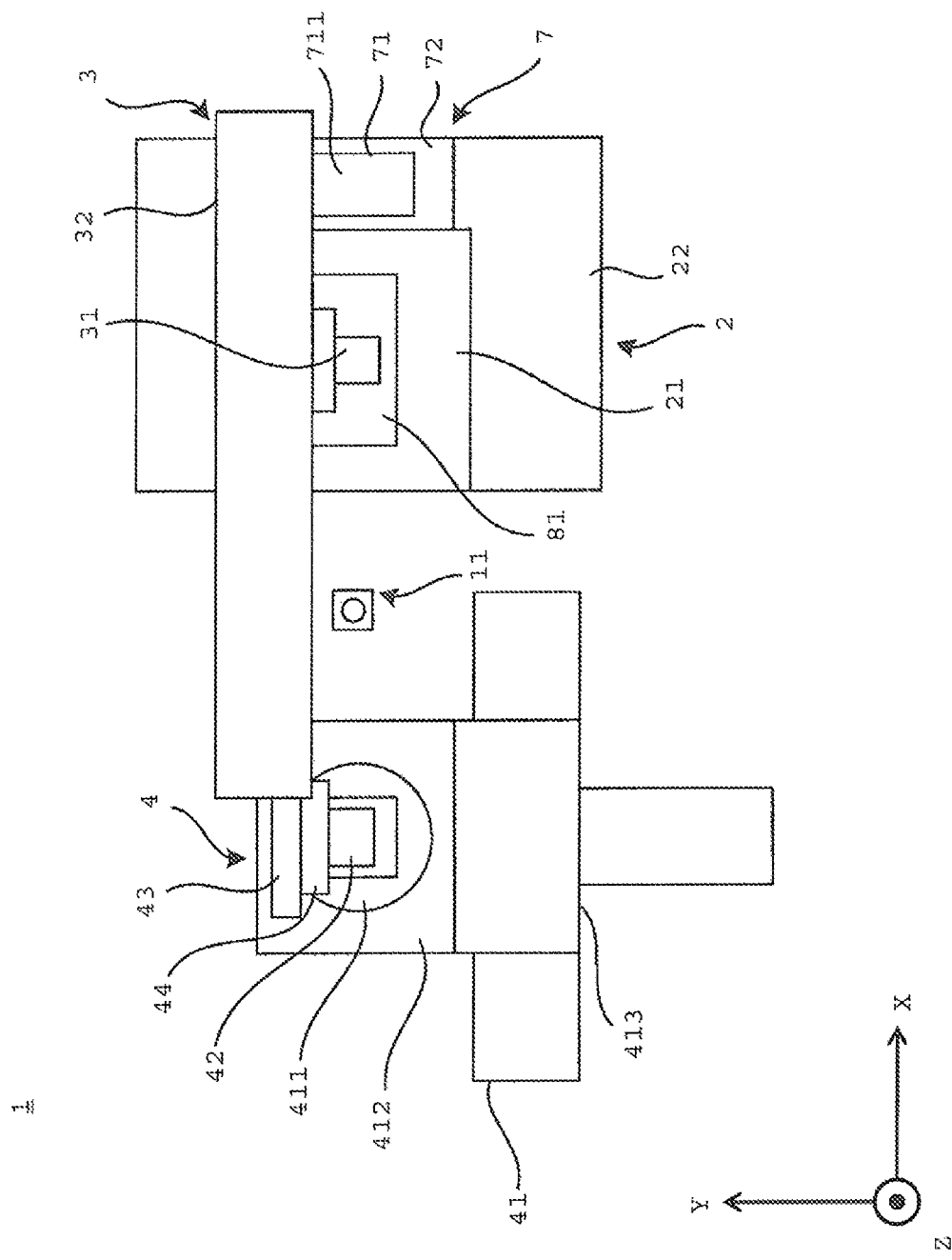
FIG. 2 is a schematic plan view of the electronic component mounting apparatus in the embodiment pertaining to the present invention.

In the beginning, mainly referring to FIGS. 1 and 2, the constitution of an electronic component mounting apparatus 1 in the present embodiment is described.

Further, FIG. 1 is a schematic front view of the electronic component mounting apparatus 1 in an embodiment pertaining to the present invention. Moreover, FIG. 2 is a schematic plan view of the electronic component mounting apparatus 1 in the embodiment pertaining to the present invention.

The electronic component mounting apparatus 1 is a so-called flip-chip implementing apparatus that inverts a minute electronic component 8 (see FIG. 3, the same hereinafter) used in system LSI (Large Scale Integration) and the like, and simultaneously carries out mounting and joining of the inverted electronic component 8 to a circuit board 81 as a target object such as a printed board and the like.

The electronic component mounting apparatus 1 comprises a circuit board holding part 2, an electronic component mounting unit 3, an electronic component supplying part 4, and an image pick-up part 11.

The electronic component mounting unit 3 for mounting the electronic component 8 on the circuit board 81, which has been held by the circuit board holding part 2, is provided on the (+Z) side of the circuit board holding part 2, namely on the upper side. The electronic component supplying part 4 that supplies the electronic component 8 to the electronic component mounting unit 3 is provided on the (−X) side of the circuit board holding part 2. The image pick-up part 11 that picks up an image of the electronic component 8, which has been supplied to the electronic component mounting unit 3 by the electronic component supplying part 4, is provided between the circuit board holding part 2 and the electronic component supplying part 4. These mechanisms are controlled by a controlling part 10, and the mounting of the electronic component 8 to the circuit board 81 is carried out.

Here, the constitution of the circuit board holding part 2, the electronic component mounting unit 3, the electronic component supplying part 4, and the image pick-up part 11 is described in detail in this order.

First, the circuit board holding part 2 is a unit that holds the circuit board 81. The circuit board holding part 2 comprises a stage 21 that holds the circuit board 81, and a stage moving mechanism 22 that moves a stage 21 in the Y direction.

Next, the electronic component mounting unit 3 is a unit that mounts, on the held circuit board 81, the supplied electronic component 8. The electronic component mounting unit 3 comprises an electronic component mounting part 31, which has a pressing unit 33 and a bonding tool 5, and a mounting part moving mechanism 32 that allows the electronic component mounting part 31 to move in the X direction.

The pressing unit 33 is a unit that presses, via an electronic component holding part 53 (see FIG. 3, the same hereinafter) of the bonding tool 5, the electronic component 8 against the circuit board 81. The pressing unit 33 has a shaft 35 allowed to move in the Z direction through the use of a lifting-and-lowering mechanism having a motor (not shown), to which a tool supporting part 34 (see FIG. 3, the same hereinafter) is fixed at its lower end.

The bonding tool 5 comprises a horn 51 (see FIG. 3, the same hereinafter), an ultrasonic vibrator 52 (see FIG. 3, the same hereinafter), and the electronic component holding part 53.

The bonding tool 5 comprises, additionally, a plate-like holder 54 (see FIG. 3, the same hereinafter) that is arranged on its upper face, and holder blocks 541 and 542 (see FIG. 3, the same hereinafter) that are fixed to the holder 54. The plate-like holder 54 is connected to the tool supporting part 34 that is positioned at the lowest end of the pressing unit 33 and is fixed to the lower end of the shaft 35. The bonding tool 5 is attached to the pressing unit 33 in this way, and is lifted or lowered relatively regarding the circuit board 81.

Further, the constitution of the bonding tool 5 is later described in more detail.

Next, the electronic component supplying part 4 is a unit that supplies the electronic component 8. The electronic component supplying part 4 comprises an electronic component arranging part 41 that arranges the electronic component 8 at a predetermined position, a supplying head 42 that picks out the electronic component 8 from the electronic component arranging part 41 to hold it, a supplying head moving mechanism 43 that moves the supplying head 42 in the X direction, and a rotating mechanism 44 that rotates and slightly lifts or lowers the supplying head 42.

The electronic component arranging part 41 comprises an electronic component tray 411 on which a large number of electronic components 8 are placed, a stage 412 that holds the electronic component tray 411, and a tray moving mechanism 413 that moves the electronic component tray 411 along with the stage 412 in the X direction and the Y direction.

A large number of electronic components 8 to be mounted on the circuit board 81 are placed, with a reverse orientation concerning the orientation for mounting on the circuit board 81, on the electronic component tray 411 with the lower faces in a state after implementation, namely the joining faces on which electrode parts to be joined to the circuit board 81 are formed, facing upward.

The supplying head 42 comprises a supplying collet 421 that supplies the electronic component 8, which has been held by adsorption through the use of a sucking port formed at the tip end part, to the bonding tool 5.

Further, the electronic component 8 can be any of an LED (Light Emitting Diode) chip, a semiconductor light emitting element such as a semiconductor laser and the like, a packaged IC (Integrated Circuit), a resistor, a capacitor, a semiconductor such as a minute semiconductor bare chip and the like, a SAW (Surface Acoustic Wave) filter, and an electronic component other than a semiconductor such as a camera module and the like. Moreover, an electrode part of the electronic component 8 can be a protruding bump formed with gold (Au) on an electrode pattern of the electronic component 8, can be a plating bump and the like depending on the electronic component 8, or can be the electrode pattern itself. Moreover, a protruding bump, instead of the protruding bump formed on the electrode pattern of the electronic component 8, can be provided on an electrode of the circuit board 81. Moreover, the circuit board 81 can be any of a circuit board formed of resin, and a circuit board formed of a material other than resin such as glass, a semiconductor and the like.

And, the image pick-up part 11 is a unit that is established right below the moving route of the electronic component mounting part 31, in particular the bonding tool 5, which is moved by the mounting part moving mechanism 32, and picks up an image of the electronic component 8 held by the bonding tool 5 from the (−Z) side. The image pick-up part 11 is provided at a position free of interference with the moved electronic component mounting part 31.

Further, a polishing part 7, which polishes the tip end part 531 (see FIG. 3, the same hereinafter) of the bonding tool 5 for holding the electronic component 8, is provided on the (+X) side of the circuit board 81. The polishing part 7 comprises a sheet-like polishing member 71 that has a flat horizontal polishing face 711, and a polishing member holding part 72 that holds the polishing member 71, is attached to the (+X) side of the stage 21, and is moved integrally with the stage 21 in the Y direction by the stage moving mechanism 22.

Figure 3:
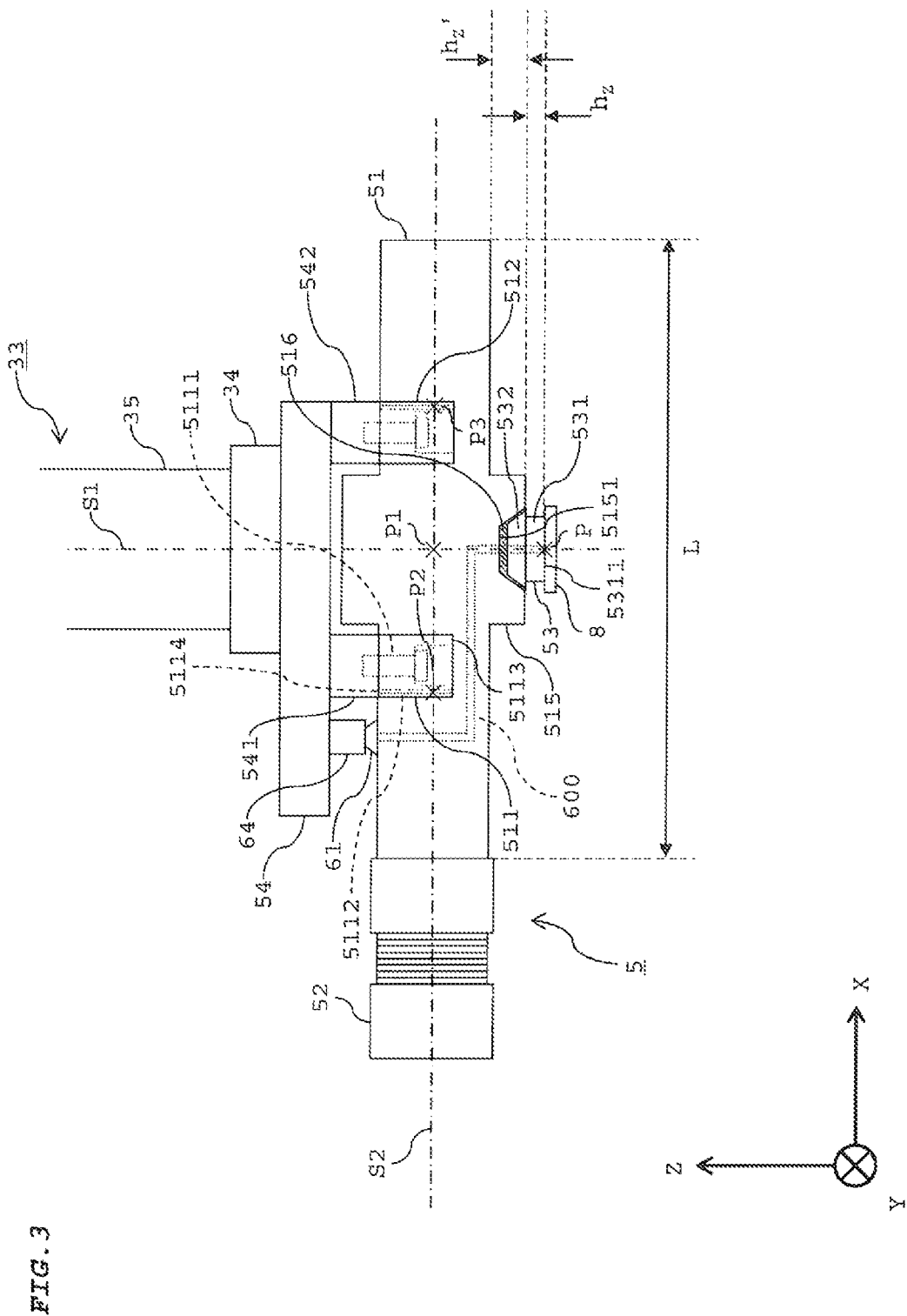
FIG. 3 is a schematic front view of a bonding tool in the embodiment pertaining to the present invention.
Figure 4:
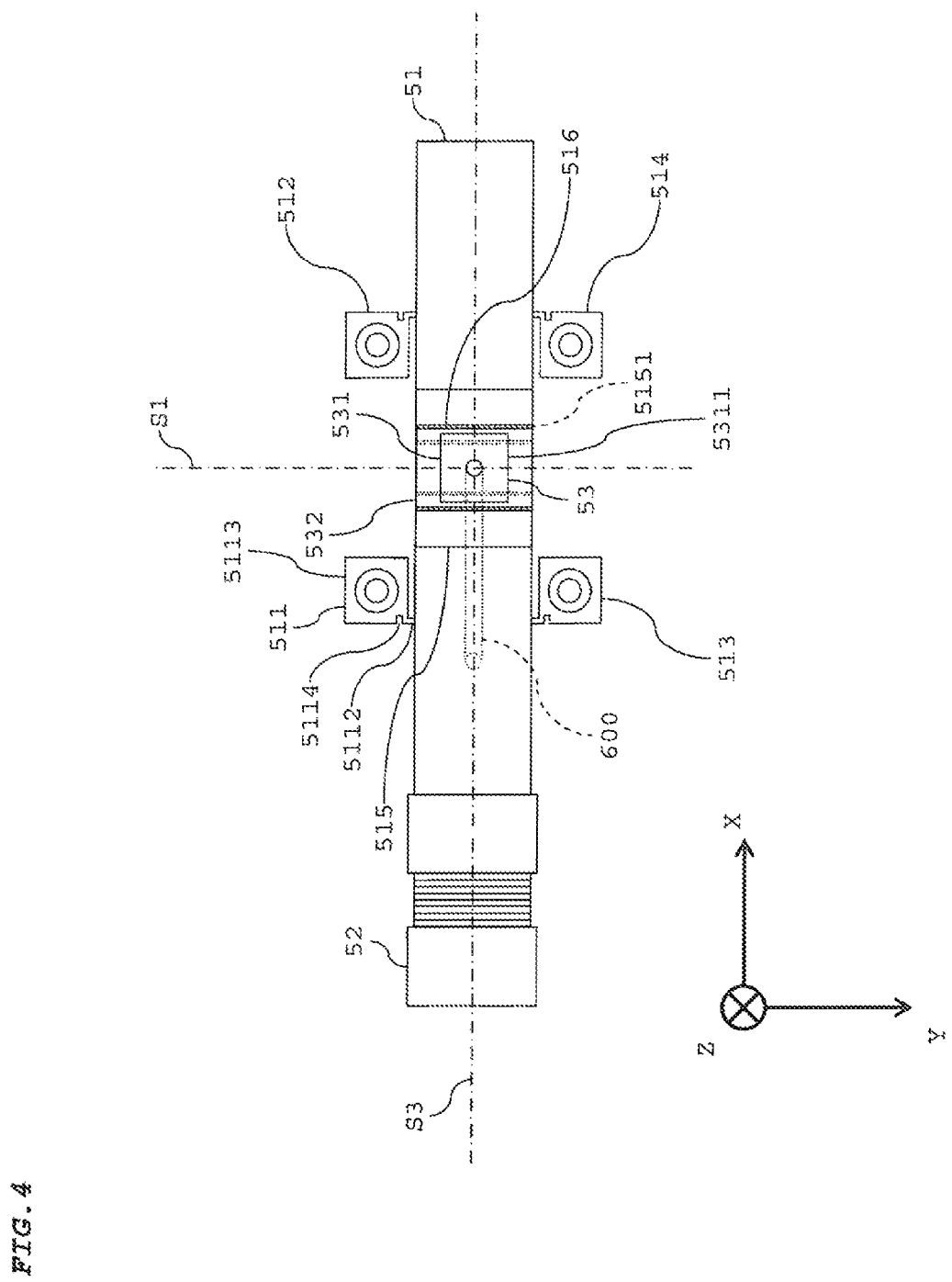
FIG. 4 is a schematic bottom view of a vicinity of a horn of the bonding tool in the embodiment pertaining to the present invention.

Here, mainly referring to FIGS. 3 and 4, the constitution of the bonding tool 5 is described in more detail (a manufacturing method of the bonding tool 5 is also described while the constitution of the bonding tool 5 is described).

Further, FIG. 3 is a schematic front view of the bonding tool 5 in the embodiment pertaining to the present invention. Moreover, FIG. 4 is a schematic bottom view of a vicinity of the horn 51 of the bonding tool 5 in the embodiment pertaining to the present invention.

As mentioned before, the bonding tool 5 comprises the horn 51, the ultrasonic vibrator 52, and the electronic component holding part 53.

The electronic component holding part 53 has a male fitting part 532 in the shape of a tapering-off, a female fitting part 5151 in the shape according to the shape of the male fitting part 532 is formed in the horn 51, and the male fitting part 532 is fitted into the female fitting part 5151 via an adhesion layer 516.

A material that constitutes the electronic component holding part 53 is, for example, ultrahard metal such that abrasion due to force received from the electronic component 8 is less prone to be caused while the electronic component 8 is mounted on the circuit board 81.

A material that constitutes the horn 51 is, for example, stainless steel selected conforming with the material such as the stainless steel and the like constituting the ultrasonic vibrator 52 so that preferable vibration characteristics and vibration transmission characteristics are guaranteed.

A material that constitutes the adhesion layer 516 is, for example, a brazing material such as a silver brazing alloy and the like that can allow the ultrahard metal constituting the electronic component holding part 53 and the stainless steel constituting the horn 51 to rigidly adhere to each other so that a transmission loss of the ultrasonic vibration is almost never generated.

Manufacture of the bonding tool 5 is able to be carried out by arranging a brazing material for forming the adhesion layer 516 between the male fitting part 532 and the female fitting part 5151, forming the adhesion layer 516 by heating the male fitting part 532 and the female fitting part 5151 in a thermostatic bath with pressurization using a predetermined jig, and fitting the male fitting part 532 into the female fitting part 5151. For example, a thin sheet-like brazing material can be stuck on an adhesion face of the male fitting part 532 or the female fitting part 5151, so that the brazing material is melted through increase of the temperature with the electronic component holding part 53 and the horn 51 being sandwiched with pressurization and the temperature is decreased afterward.

The male fitting part 532 is in the shape of a tapering-off, and the female fitting part 5151 is in the shape according to the shape of the male fitting part 532. Hence, even if no clearance is particularly ensured between the male fitting part 532 and the female fitting part 5151 with a fear that preferable vibration characteristics and vibration transmission characteristics can not be realized as mentioned before, it is possible to easily perform the process of inserting the male fitting part 532 deeply into the female fitting part 5151.

Further, the constitution is later described in more detail in which the male fitting part 532 of the electronic component holding part 53 is fitted into the female fitting part 5151 of the horn 51 via the adhesion layer 516.

Here, the constitution of the ultrasonic vibrator 52, the horn 51, and the electronic component holding part 53 is described in more detail in this order.

The ultrasonic vibrator 52 is a unit that is provided at one end of the horn 51 on the (−X) side, and generates an ultrasonic vibration using a piezoelectric element (not shown). The ultrasonic vibration generated by the ultrasonic vibrator 52 is transmitted by the horn 51 to the electronic component holding part 53 as a longitudinal vibration, and is applied to the electronic component 8 via the electronic component holding part 53.

Next, the horn 51 is a unit that transmits the ultrasonic vibration.

The horn 51 is substantially a prism in shape, whose longer direction is the X direction in which the ultrasonic vibration is transmitted. The horn 51 has a length L with the X direction as the longer direction in which the ultrasonic vibration is transmitted, and has a symmetry plane S1 (namely, a plane that bisects the above-mentioned length L) parallel to the YZ plane, a symmetry plane S2 parallel to the XY plane, and a symmetry plane S3 parallel to the ZX plane.

The horn 51 is in a resonant state at a predetermined frequency of the ultrasonic vibration, and has structure to stabilize the ultrasonic vibration by amplification.

An anti-nodal point P1 is a point that indicates a position in the X direction, which corresponds to a loop where the amplitude of ultrasonic vibration is at the maximum in a resonant state. The ultrasonic vibration in the present embodiment has two nodes, where a nodal point P2 closer to the one end of the horn 51 on the (−X) side, and a nodal point P3 closer to the other end of the horn 51 on the (+X) side are points that indicate positions in the X direction, which correspond to nodes where the amplitude of ultrasonic vibration is roughly zero in a resonant state. The anti-nodal point P1 exists on the symmetry plane S1, and nodal points P2 and P3 exist so as to be roughly plane-symmetrical to each other with respect to the symmetry plane S1.

The female fitting part 5151 in the shape according to the shape of the male fitting part 532 is formed in a horn protruding part 515 that is provided on the lower face among the two faces of the horn 51 parallel to the XY plane, which is on the (−Z) side, on a basis of the position of the anti-nodal point P1 with regard to the X direction. The female fitting part 5151 is a groove whose cross-sectional shape is trapezoidal. And, the groove is formed in a face on a lower side among the two faces of the prism parallel to the XY plane, which is on the (−Z) side, in the Y direction orthogonal to the X direction that is the longer direction of the prism.

Concerning horn holding blocks 511, 512, 513 and 514, two of them are provided on one of the both side faces of the horn 51 parallel to the ZX plane, and the remaining two on the other. More concretely, the horn holding blocks 511 and 512 are provided on the side face among the two faces of the horn 51 parallel to the ZX plane, which is on the (−Y) side, and the horn holding blocks 513 and 514 are provided on the side face among the two faces of the horn 51 parallel to the ZX plane, which is on the (+Y) side.

And, the horn holding blocks 511 and 513 are provided on a basis of the position of the nodal point P2 with regard to the X direction, and the horn holding blocks 512 and 514 are provided on a basis of the position of the nodal point P3 with regard to the X direction.

The horn holding blocks 511 and 513 are fixed to the holder block 541, and the horn holding blocks 512 and 514 are fixed to the holder block 542.

Here, since the horn holding blocks 511, 512, 513 and 514 have similar constitution, the constitution of the horn holding block 511 is described in detail.

The horn holding block 511 has a rib 5112 that is provided on the side face among the two faces of the horn 51 parallel to the ZX plane, which is on the (−Y) side, on a basis of the position of the nodal point P2, and a main body 5113 that is joined to the rib 5112. The main body 5113 has a slit 5114 that is formed in the longer direction of the rib 5112, adjacent to the rib 5112. The horn holding block 511 is fixed to the holder block 541 by a horn fixing screw 5111 that is inserted in a hole penetrating the main body 5113 in the Z direction.

The rib 5112 is substantially a thin prism in shape such that the direction of height, which is the longer direction, is the Z direction orthogonal to the X direction in which the ultrasonic vibration is transmitted, and the direction of width is the X direction.

Further, it is desirable to set the height of the rib 5112 sufficiently large also in consideration of the physical properties and so forth of the horn 51. The reason is that it is necessary to ensure, with regard to the Z direction in which the pressing unit 33 presses the electronic component 8, sufficient rigidity to transmit the pressing force while enduring the load at the time of pressing. In the present embodiment, since the horn holding blocks 511, 512, 513 and 514 are provided with two for each of the both side faces of the horn 51 parallel to the ZX plane and ribs of sufficient number having similar constitution to that of the rib 5112 are provided, it is possible to ensure the rigidity to be able to sufficiently endure the load at the time of pressing according to the increase of size, number and so on of the electronic components 8.

Moreover, it is desirable to set the width of the rib 5112 sufficiently small also in consideration of the physical properties and so forth of the horn 51. The reason is that it is necessary to ensure, with regard to the X direction in which the ultrasonic vibration is transmitted, sufficient degree of freedom to allow the electronic component 8 to vibrate by the ultrasonic vibration. Of course, the slit 5114 is a structure for ensuring still larger such degree of freedom.

And, the electronic component holding part 53 is a unit that holds the electronic component 8.

The electronic component holding part 53 has the male fitting part 532 in the shape of a tapering-off, and the electronic component holding face 5311, which is provided on the tip end part 531, to hold the electronic component 8 on the opposite side to the male fitting part 532. The male fitting part 532 is a ridge whose cross-sectional shape is trapezoidal.

The electronic component holding part 53 is roughly plane-symmetrical both with respect to the symmetry plane S1 and with respect to the symmetry plane S3.

The electronic component holding part 53 has, at the mounting center point P on the line of intersection between the symmetry plane S1 and the symmetry plane S3, the tip end part 531 for holding the electronic component 8 by vacuum adsorption using a sucking path 600. The tip end part 531 is a column in shape, which has a height $h_z$ in the Z direction and has a cross-sectional shape optimum for the size and type of the electronic component 8.

Further, the height $h_z$ of the tip end part 531 is designed, in consideration of the height $h_z'$ of the horn protruding part 515 in the Z direction and the like, in dimensions with a degree such that, when the electronic component 8 is mounted on the circuit board 81, the electronic component holding part 53 does not collide with other electronic components, which have been already mounted on the circuit board 81, and great flexural vibration is not generated.

Moreover, the sucking path 600 is connected, via an adsorption pad 61 of silicone resin and the like connected to a highly heat-resistant tube 64, to a vacuum pump (not shown) through the holder 54 and the tool supporting part 34.

Figure 5:
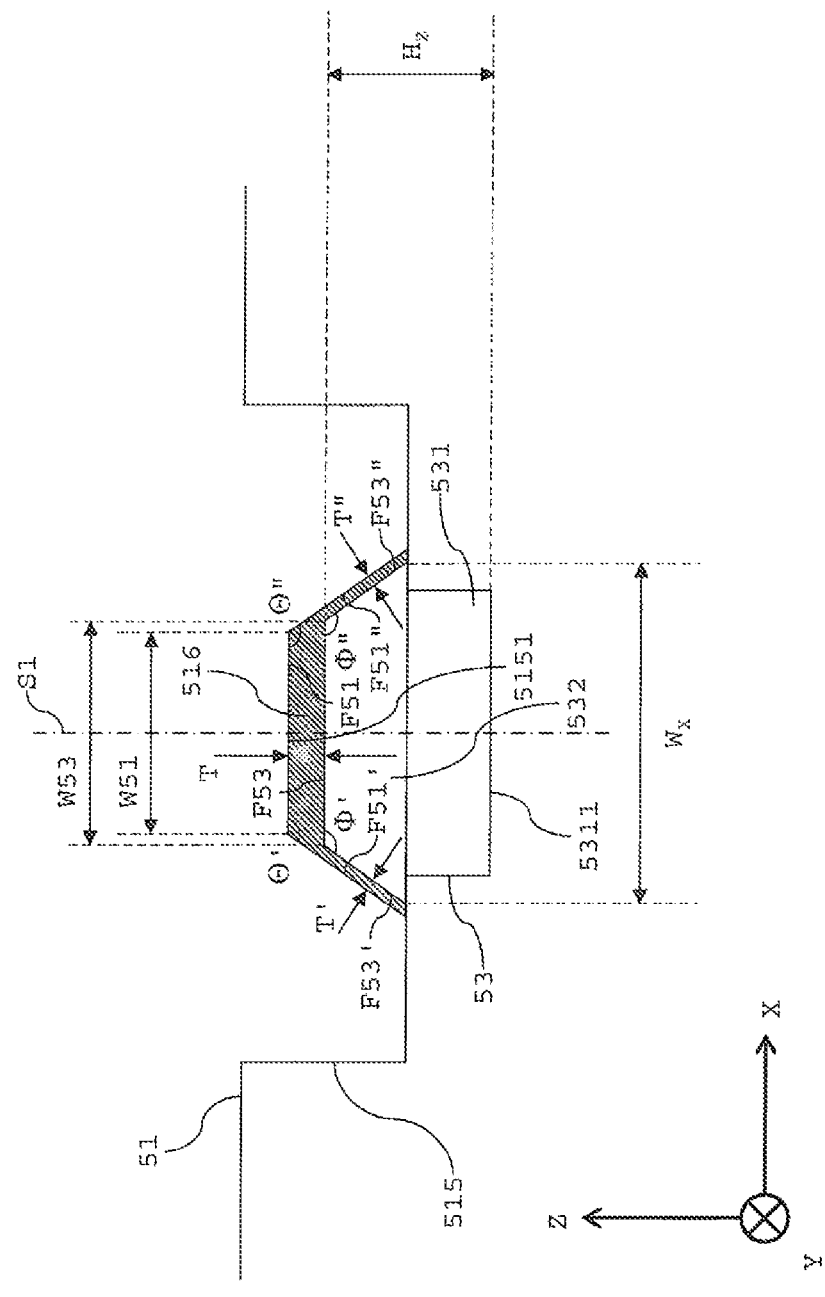
FIG. 5 is a schematic front view (I) of a vicinity of an electronic component holding part of the bonding tool in the embodiment pertaining to the present invention.

Here, mainly referring to FIG. 5, the constitution is described in more detail in which the male fitting part 532 of the electronic component holding part 53 is fitted into the female fitting part 5151 of the horn 51 via the adhesion layer 516.

Further, FIG. 5 is a schematic front view (I) of a vicinity of the electronic component holding part 53 of the bonding tool 5 in the embodiment pertaining to the present invention.

As mentioned before, the male fitting part 532 is a ridge whose cross-sectional shape is trapezoidal, and the female fitting part 5151 is a groove whose cross-sectional shape is trapezoidal.

The male fitting part 532 has a top face F53 of the ridge, and side faces F53' and F53" of the ridge. The top face F53 of the ridge is parallel to the XY plane parallel to the X direction in which the ultrasonic vibration is transmitted. The side face F53' of the ridge on the (–X) side and the side face F53" of the ridge on the (+X) side are parallel to the Y direction but are nonparallel to the top face F53, and exist so as to be roughly plane-symmetrical both with respect to the symmetry plane S1 and with respect to the symmetry plane S3. And, a tapered shape is formed, which is roughly plane-symmetrical both with respect to the symmetry plane S1 and with respect to the symmetry plane S3 and is widened toward the (–Z) side, namely, narrowed toward the (+Z) side.

The female fitting part 5151 is in the shape according to the shape of the male fitting part 532 as mentioned before, and has a bottom face F51, and side faces F51' and F51".

The thickness T of the adhesion layer 516 between the top face F53 of the ridge and the bottom face F51 of the groove is (1) larger than the thickness T' of the adhesion layer 516 between the side face F53' of the ridge and the side face F51' of the groove on which the side face F53' of the ridge faces via the adhesion layer 516, and (2) larger than the thickness T" of the adhesion layer 516 between the side face F53" of the ridge and the side face F51" of the groove on which the side face F53" of the ridge faces via the adhesion layer 516.

And, the top face F53 of the ridge faces on the bottom face F51 of the groove via the adhesion layer 516, and the width W53 of the top face F53 of the ridge is larger than the width W51 of the bottom face F51. When the width W53 is allowed to be larger than the width W51, since the male fitting part 532 is restrained from being inserted too deeply into the female fitting part 5151, it is possible to realize the constitution in which the thickness T is allowed to be largish, and it is easy to realize the constitution in which the thickness T is allowed to be larger than the thicknesses T' and T" as mentioned before.

Although the thickness of the before-mentioned sheet-like brazing material for forming the adhesion layer 516 is roughly uniform, when the male fitting part 532 and the female fitting part 5151 are heated with pressurization, the sheet-like brazing material, which has been arranged in the spaces between the side face F53' and the side face F51' and between the side face F53" and the side face F51", is melted to flow into the space between the top face F53 and the bottom face F51, and it is possible to finally realize the above-mentioned constitution in which the thickness T is larger than the thicknesses T' and T". Of course, it is desirable that a quantity of the sheet-like brazing material be adjusted so that the adhesion layer 516 fills up• the space between the male fitting part 532 and the female fitting part 5151.

Further, in regard to the constitution in which the thicknesses T' and T" are allowed to be smallish, a position aberration of the electronic component holding part 53 with respect to the X direction is less prone to be generated while the electronic component holding part 53 and the horn 51 are sandwiched to be pressurized in a state where the brazing material is melted as mentioned before. Hence, since plane symmetry with respect to the symmetry plane S1 of the electronic component holding part 53 is less prone to be impaired while the male fitting part 532 is fitted into the female fitting part 5151, it is possible to realize more preferable vibration characteristics and vibration transmission characteristics.

Furthermore, in regard to the constitution in which the thicknesses T' and T" are allowed to be smallish, a vibration of the horn 51, which is generated as a displacement in the X direction causing a local slip in the joining face that is necessary for bonding, propagates to the electronic component holding part 53 with efficiency roughly as it is without being absorbed by the adhesion layer 516. Hence, since there is then less fear that such a vibration necessary for bonding vanishes, stability of the ultrasonic vibration given to the electronic component 8 is improved.

Figure 6:
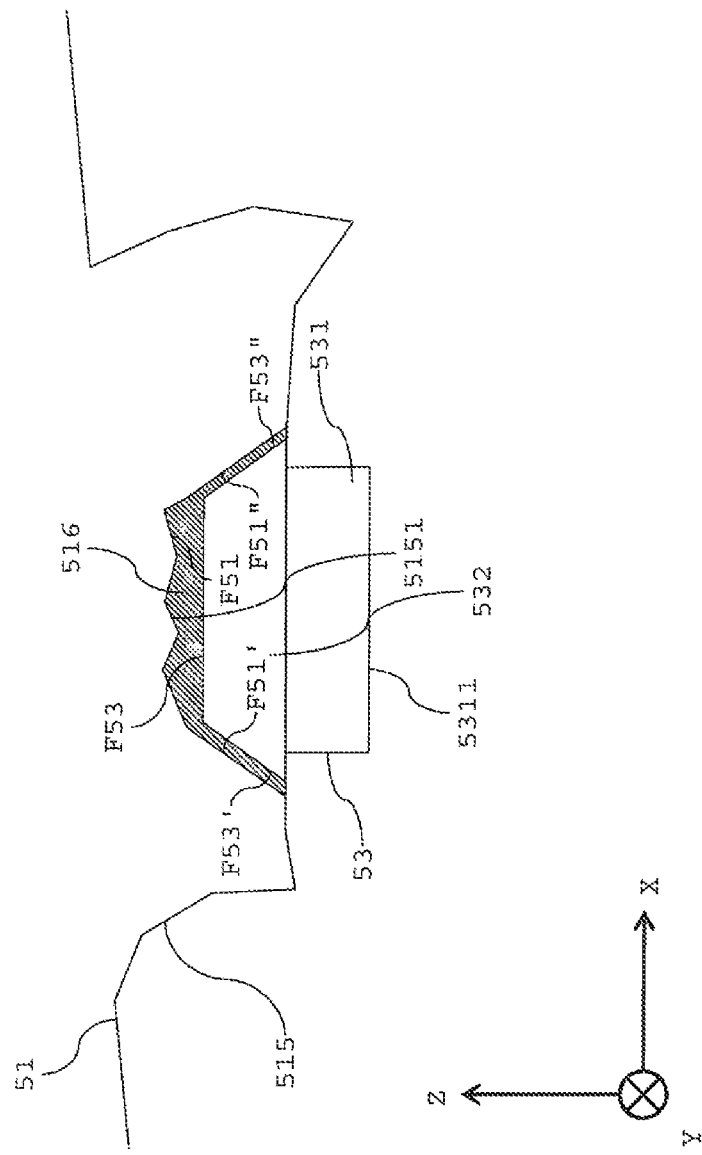
FIG. 6 is a schematic front view of a vicinity of the electronic component holding part, to which ultrasonic vibration is being given, of the bonding tool in the embodiment pertaining to the present invention.

Moreover, in regard to the constitution in which the thicknesses T is allowed to be largish, as shown in FIG. 6 that is a schematic front view of a vicinity of the electronic component holding part 53, to which ultrasonic vibration is being given, of the bonding tool 5 in the embodiment pertaining to the present invention, swell of the horn 51 to be generated as a displacement in the Z direction, being absorbed by the adhesion layer 516, almost never propagates to the electronic component holding part 53. Hence, since there is then less fear that flatness of the electronic component holding face 5311 is impaired even in a case where the size of the electronic component 8 is relatively large or anything, homogeneity of the ultrasonic vibration given to the electronic component 8 is improved.

But, it is desirable that the thickness of the adhesion layer 516 be, at any place, 200 µm or less. When the thickness of the adhesion layer 516 is allowed to be 200 µm or less at any place, there is almost no fear that a transmission loss of the ultrasonic vibration is to be generated because even the aforesaid vibration of the horn 51 necessary for bonding is absorbed by the adhesion layer 516.

Additionally, the angle Φ' at the edge between the top face F53 and the side face F53' is an obtuse angle and equals the angle Φ" at the edge between the top face F53 and the side face F53" (namely, Φ'=Φ">90°), and the angle Θ' at the edge between the bottom face F51 and the side face F51' is an obtuse angle and equals the angle Θ" at the edge between the bottom face F51 and the side face F51" (namely, Θ'=Θ">90°).

Further, when the angle Φ' is allowed to be equal to the angle Θ' (namely, Φ'=Θ'), since gaps are less prone to be caused between the male fitting part 532 and the female fitting part 5151, it is easy to realize the constitution in which the thicknesses T' and T" are allowed to be smallish.

Figure 7:
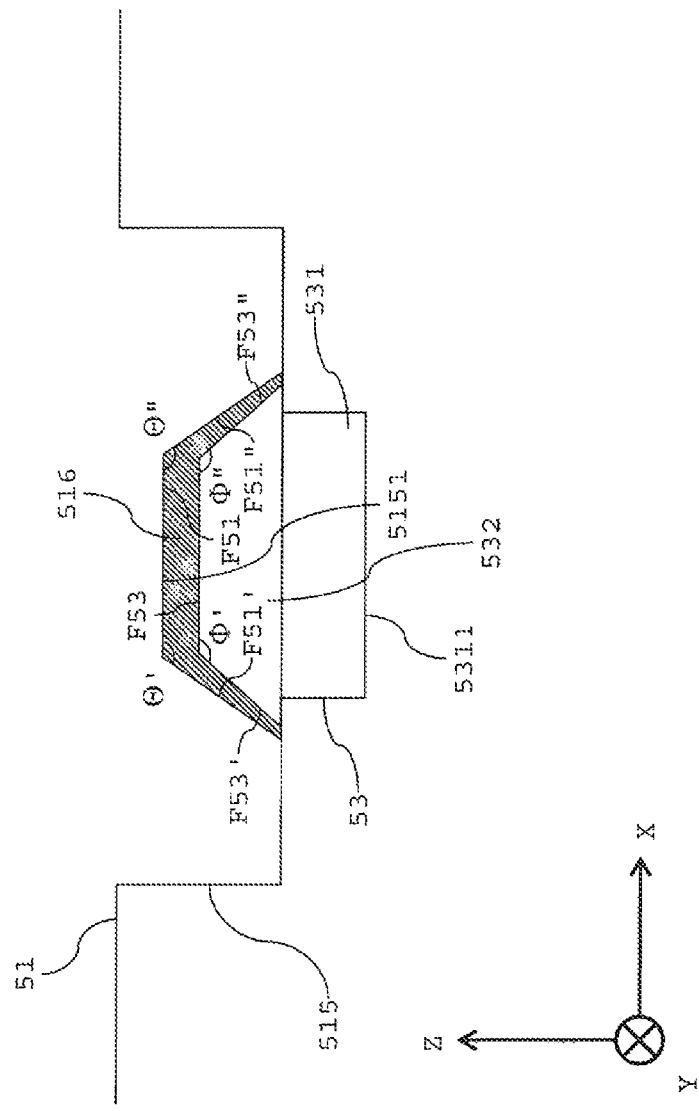
FIG. 7 is a schematic front view (II) of a vicinity of the electronic component holding part of the bonding tool in the embodiment pertaining to the present invention.

Moreover, as shown in FIG. 7 that is a schematic front view (II) of a vicinity of the electronic component holding part 53 of the bonding tool 5 in the embodiment pertaining to the present invention, when the angle Φ' is allowed to be larger than the angle Θ' (namely, Φ'>Θ'), it is possible to more easily perform the process of inserting the male fitting part 532 deeply into the female fitting part 5151.

Figure 8:
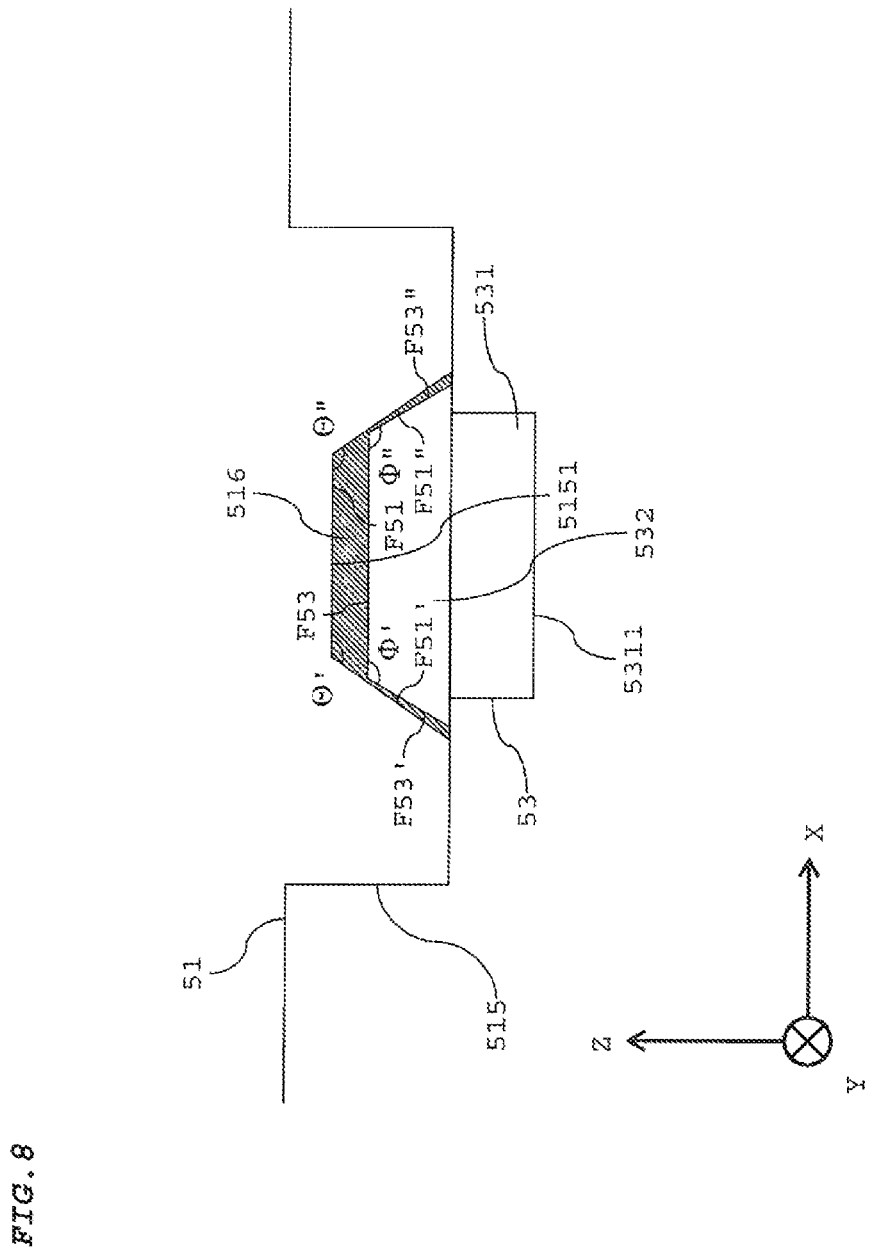
FIG. 8 is a schematic front view (III) of a vicinity of the electronic component holding part of the bonding tool in the embodiment pertaining to the present invention.

Moreover, as shown in FIG. 8 that is a schematic front view (III) of a vicinity of the electronic component holding part 53 of the bonding tool 5 in the embodiment pertaining to the present invention, when the angle Φ' is allowed to be smaller than the angle Θ' (namely, Φ'<Θ'), since the male fitting part 532 is restrained from being inserted too deeply into the female fitting part 5151, it is easy to realize the constitution in which the thickness T is allowed to be largish.

Figure 9:
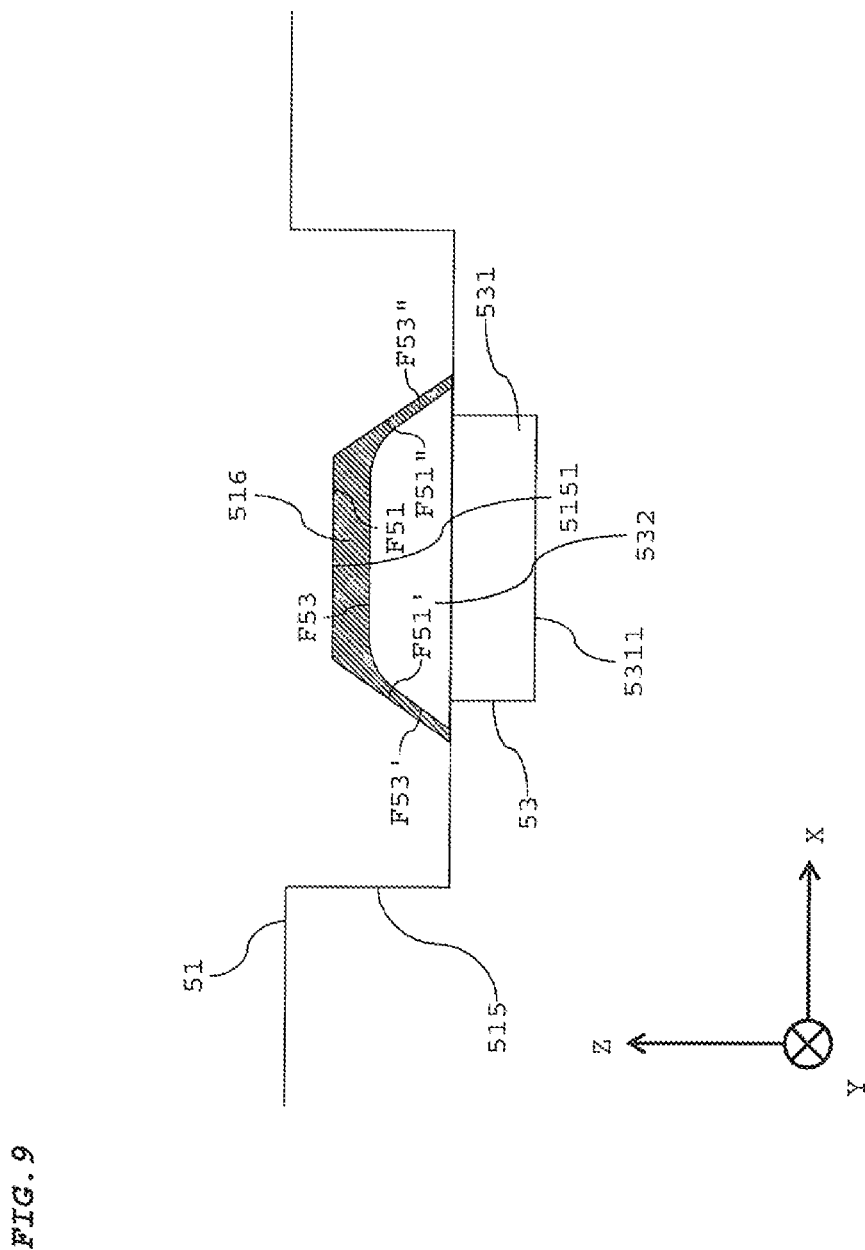
FIG. 9 is a schematic front view (IV) of a vicinity of the electronic component holding part of the bonding tool in the embodiment pertaining to the present invention.
Figure 10:
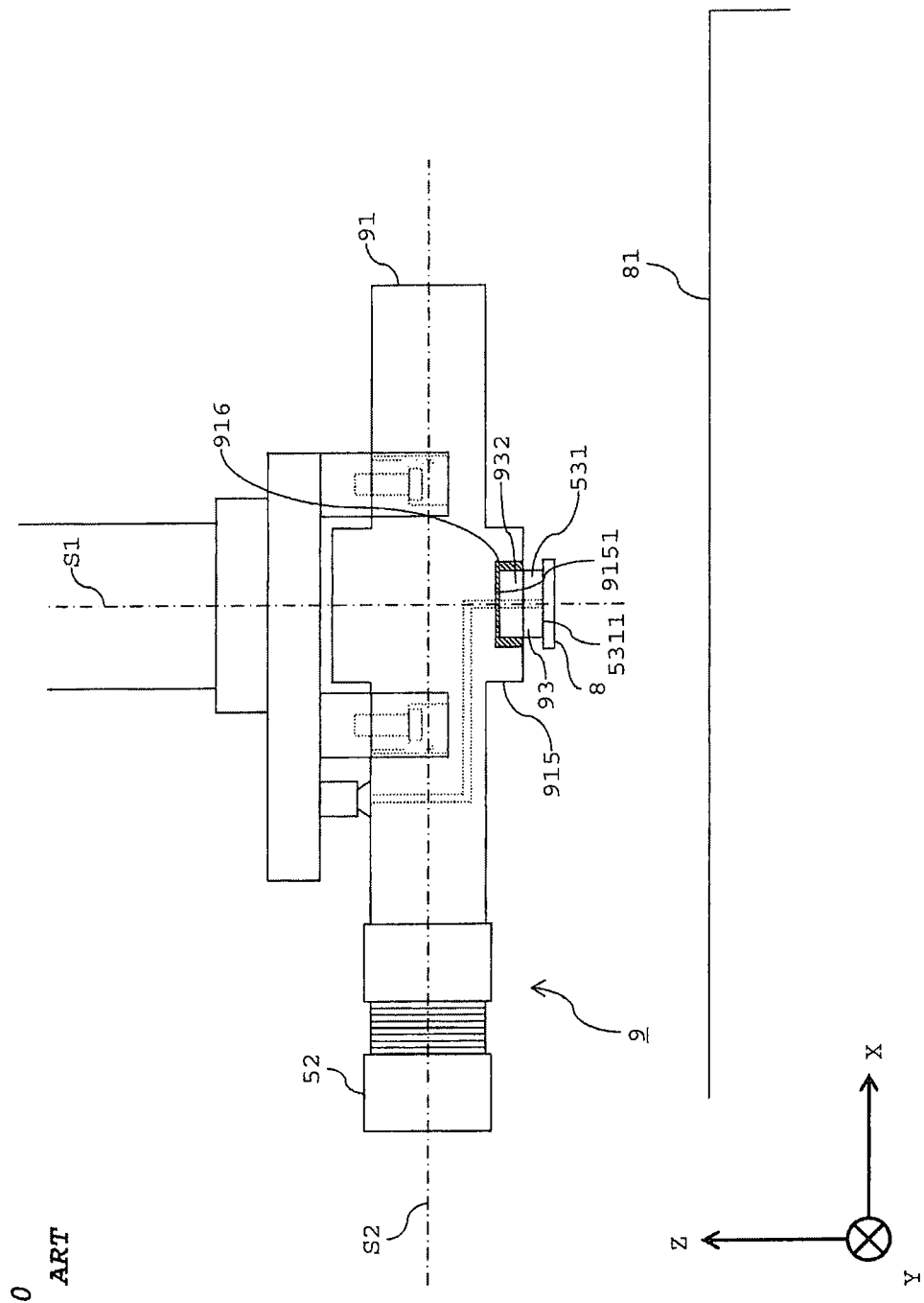
FIG. 10 is a schematic front view of a conventional bonding tool.
Figure 11:
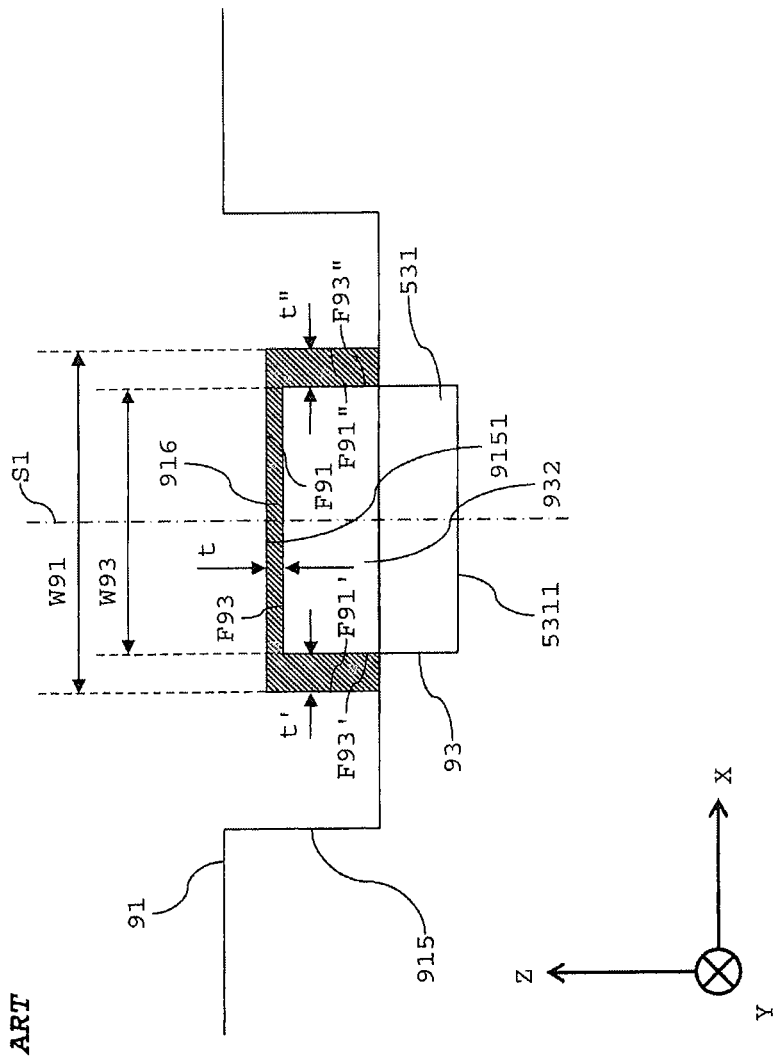
FIG. 11 is a schematic front view of a vicinity of an electronic component holding part of the conventional bonding tool.
Figure 12:
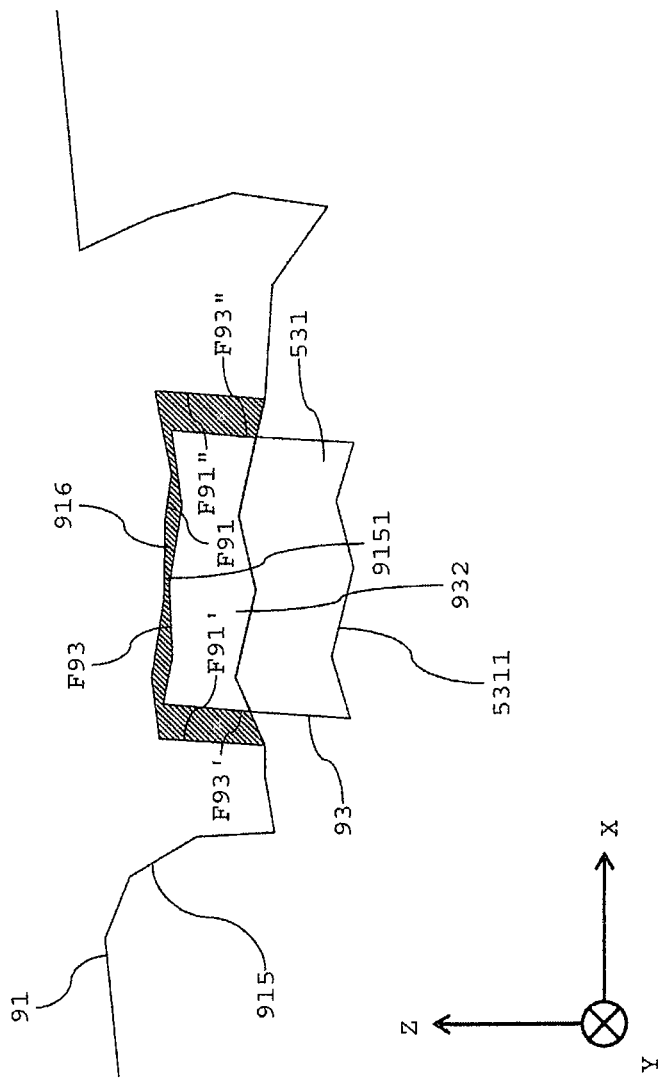
FIG. 12 is a schematic front view of a vicinity of the electronic component holding part, to which ultrasonic vibration is being given, of the conventional bonding tool.

Of course, as shown in FIG. 9 that is a schematic front view (IV) of a vicinity of the electronic component holding part 53 of the bonding tool 5 in the embodiment pertaining to the present invention, the edge between the top face F53 and the side face F53' and/or the edge between the top face F53 and the side face F53" can be rounded off by trimming the corners.

It is desirable that 1/10 or more be the ratio (height $H_z$/width $W_x$) of the height $H_z$ of the electronic component holding part 53 in the Z direction orthogonal to the electronic component holding face 5311 to the width $W_x$ of the electronic component holding part 53 in the X direction in which the ultrasonic vibration is transmitted. When height $H_z$/width $W_x$ is allowed to be like this, since the electronic component holding part 53 does not have so flattened shape, and cracking due to difference in coefficient of thermal expansion and the like between the electronic component holding part 53, the horn 51 and the adhesion layer 516 is restrained from being generated in the electronic component holding part 53 and/or the adhesion layer 516 even while the male fitting part 532 is fitted into the female fitting part 5151 as mentioned before, it is possible to realize more preferable vibration characteristics and vibration transmission characteristics.

It is desirable that Young's modulus of the material that constitutes the horn 51 be larger than Young's modulus of the material that constitutes the adhesion layer 516, and Young's modulus of the material that constitutes the electronic component holding part 53 be larger than Young's modulus of the material that constitutes the adhesion layer 516. Further, the ultrahard metal constituting the electronic component holding part 53 is followed by the stainless steel constituting the horn 51 and the brazing material constituting the adhesion layer 516 in descending order of Young's modulus showing the stress necessary for causing the unit strain within the elastic range. When the magnitude correlation of Young's modulus is allowed to be like this, since the above-mentioned swell of the horn 51 is absorbed by the adhesion layer 516, which has a lower rigidity than the horn 51, and almost never propagates to the electronic component holding part 53, which has a higher rigidity than the adhesion layer 516, and there is then less fear that flatness of the electronic component holding face 5311 is impaired even in a case where the size of the electronic component 8 is relatively large or anything, homogeneity of the ultrasonic vibration given to the electronic component 8 is still more improved.

Next, mainly referring to FIGS. 1-3, the operation of the electronic component mounting apparatus 1 in the present embodiment is described.

The tray moving mechanism 413 allows the electronic component tray 411, on which a large number of electronic components 8 with the joining faces facing toward the (+Z) side are placed, to move below the supplying head 42 that is positioned on the (−X) side, and the supplying collet 421 adsorbs the joining face of the electronic component 8 by sucking.

The supplying head moving mechanism 43 allows the supplying head 42 to move in the (+X) direction while inverting it, and the supplying collet 421 is opposed to the bonding tool 5 at a position for carrying out transfer of the electronic component 8.

The pressing unit 33 slightly lowers the shaft 35 and, when the bonding tool 5 receives the electronic component 8 from the supplying collet 421 by sucking, the supplying collet 421 stops the sucking.

The pressing unit 33 slightly lifts the shaft 35, and the supplying head 42 shunts to the original position.

The electronic component mounting part 31 moves right above the image pick-up part 11, and the image pick-up part 11 picks up an image of the electronic component 8 held by the electronic component holding part 53 of the bonding tool 5.

The image pick-up part 11 outputs an image data, and the controlling part 10 controls the electronic component mounting part 31 on the basis of the output image data and corrects the posture of the electronic component 8.

Further, in case the controlling part 10 judges that the posture of the electronic component 8 is in a state of being uncorrectable because of adsorption error and the like, the mounting operation of the electronic component 8 is aborted, the electronic component mounting part 31 moves above a component collection mechanism (not shown), and the electronic component 8 is collected.

The mounting part moving mechanism 32 allows the electronic component mounting part 31 to move above the circuit board 81 held by the circuit board holding part 2, on which the electronic component 8 is to be mounted.

The bonding tool 5 lowers toward the circuit board 81, and a bump formed on the joining face of the electronic component 8 and an electrode in the circuit board 81 come in contact with each other.

The pressing unit 33 lowers the shaft 35 and presses the electronic component 8.

The ultrasonic vibrator 52 of the bonding tool 5 generates ultrasonic vibration.

The bump formed on the joining face of the electronic component 8 is joined to the electrode in the circuit board 81 electrically, and the joining of the electronic component 8 is carried out simultaneously with its mounting.

When the mounting of the electronic component 8 is finished, the bonding tool 5 stops the sucking, and the pressing unit 33 lifts the bonding tool 5.

It is confirmed whether polishing of the face of the tip end part 531, which abuts against the electronic component 8, is necessary or not.

In case it is judged that the polishing is necessary, the electronic component mounting part 31 moves above the polishing part 7, the tip end part 531 is pressed against the polishing member 71, and the vibration for polishing by the ultrasonic vibrator 52 is given.

In case the polishing of the tip end part 531 is finished, or in case it is judged that the polishing is unnecessary, it is confirmed whether the mounting of the electronic component 8 is continued or not.

In case the mounting of the electronic component 8 is continued, the electronic component mounting part 31 again moves to the position for carrying out transfer of the electronic component 8 with the supplying collet 421, and the aforesaid mounting operation for mounting the electronic component 8 on the circuit board 81 is repeated.

And, when all necessary electronic components 8 are mounted on the circuit board 81, the mounting operation is finished.

Further, the aforesaid mathematical terms such as parallel and the like inclusively mean, besides the case of being strictly parallel, the cases of being roughly parallel and the like as long as there is no hindrance to achieve those functions.

Of course, the present invention is not restricted to the above-mentioned embodiments, and various modifications can be contemplated.

INDUSTRIAL APPLICABILITY

A bonding tool, an electronic component mounting apparatus, and a manufacturing method of a bonding tool pertaining to the present invention are capable of carrying out ultrasonic joining of higher quality, and are useful for mounting electronic components on a circuit board, for example.

DESCRIPTION OF SYMBOLS 8 electronic component
81 circuit board 33 pressing unit
34 tool supporting part
35 shaft
5 bonding tool
51 horn
511, 512, 513, 514 horn holding block
5111 horn fixing screw
5112 rib
5113 main body
5114 slit
515 horn protruding part
5151 female fitting part
516 adhesion layer
52 ultrasonic vibrator
53 electronic component holding part
531 tip end part
5311 electronic component holding face
532 male fitting part
54 holder
541, 542 holder block
61 adsorption pad
64 tube
600 sucking path

The invention claimed is:

1. A bonding tool comprising:
a horn that transmits an ultrasonic vibration;
an ultrasonic vibrator that is provided at one end of the horn, and generates the ultrasonic vibration; and
an electronic component holding part that holds an electronic component, wherein the electronic component holding part has a male fitting part, and an electronic component holding face that holds the electronic component on an opposite side to the male fitting part,
a female fitting part in a shape according to a shape of the male fitting part is formed in a predetermined face of the horn,
the male fitting part is fitted into the female fitting part via an adhesion layer
the male fitting part is a ridge whose cross-sectional shape is trapezoidal,
the female fitting part is a groove whose cross-sectional shape is trapezoidal,
a top face of the ridge contacts a bottom face of the groove via the adhesion layer,
a width of the top face of the ridge is larger than a width of the bottom face of the groove,
the horn is in a shape whose longer direction is a direction in which the ultrasonic vibration is transmitted,
the groove is formed in a face on a lower side of the horn, in a direction orthogonal to the longer direction, and
a thickness of the adhesion layer between the top face of the ridge and the bottom face of the groove is larger than a thickness of the adhesion layer between a side face of the ridge and a side face of the groove, the side face of the ridge contacts via the adhesion layer, so that (i) a vibration of the horn in the direction in which the ultrasonic vibration is transmitted propagates to the electronic component holding part without being absorbed by the adhesion layer between the side face of the ridge and the side face of the groove, the side face of the ridge contacts via the adhesion layer, and (ii) swell of the horn in a direction orthogonal to the electronic component holding face, which is generated by the vibration of the horn, is absorbed by the adhesion layer between the top face of the ridge and the bottom face of the groove.

2. The bonding tool according to claim 1, wherein 200 μm or less is the thickness of the adhesion layer.

3. The bonding tool according to claim 1, wherein 1/10 or more is a ratio (height/width) of a height of the electronic component holding part in the direction orthogonal to the electronic component holding face to a width of the electronic component holding part in the direction in which the ultrasonic vibration is transmitted.

4. The bonding tool according to claim 1, wherein
Young's modulus of a material that constitutes the horn is larger than Young's modulus of a material that constitutes the adhesion layer, and
Young's modulus of a material that constitutes the electronic component holding part is larger than the Young's modulus of the material that constitutes the adhesion layer.

5. The bonding tool according to claim 1, wherein a material that constitutes the adhesion layer is a brazing material.

6. An electronic component mounting apparatus, comprising:
a circuit board holding part that holds a circuit board;
an electronic component supplying part that supplies the electronic component; and
an electronic component mounting unit that mounts, on the held circuit board, the supplied electronic component, wherein
the electronic component mounting unit has an electronic component mounting part,
the electronic component mounting part has a pressing unit, and the bonding tool according to claim 1, and
the pressing unit presses, via the electronic component holding part of the bonding tool, the electronic component against the circuit board.

7. A manufacturing method of the bonding tool according to claim 1, comprising:
a male fitting part forming step of forming the male fitting part;
a female fitting part forming step of forming the female fitting part;
a brazing material arranging step of arranging a brazing material for forming the adhesion layer between the male fitting part and the female fitting part; and
a fitting step of forming the adhesion layer by heating the male fitting part and the female fitting part in a thermostatic bath with pressurization using a predetermined jig, and fitting the male fitting part into the female fitting part.

* * * * *